United States Patent
Kang et al.

(10) Patent No.: US 6,944,050 B2
(45) Date of Patent: Sep. 13, 2005

(54) NONVOLATILE MEMORY DEVICE

(75) Inventors: Hee Bok Kang, Daejeon (KR); Young Jin Park, Sungnam-si (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 0 days.

(21) Appl. No.: 10/629,903

(22) Filed: Jul. 30, 2003

(65) Prior Publication Data

US 2004/0125643 A1 Jul. 1, 2004

(30) Foreign Application Priority Data

Dec. 30, 2002 (KR) .................................. 10-2002-0086704

(51) Int. Cl.[7] .............................................. G11C 11/00
(52) U.S. Cl. ..................... 365/158; 365/154; 365/156; 365/163
(58) Field of Search ................................ 365/158, 154, 365/156, 185.05, 163

(56) References Cited

U.S. PATENT DOCUMENTS

| | | | |
|---|---|---|---|
| 5,566,107 A | 10/1996 | Gilliam | |
| 5,581,501 A | 12/1996 | Sansbury et al. | |
| 6,175,525 B1 | 1/2001 | Fulkerson et al. | |
| 6,191,973 B1 | 2/2001 | Moyer | |
| 6,269,029 B1 * | 7/2001 | Suh | 365/189.06 |
| 6,304,477 B1 * | 10/2001 | Naji | 365/50 |
| 6,317,359 B1 * | 11/2001 | Black et al. | 365/158 |
| 6,411,545 B1 | 6/2002 | Caywood | |
| 6,714,441 B1 * | 3/2004 | Fulkerson et al. | 365/158 |

FOREIGN PATENT DOCUMENTS

WO           02/078007 A1    10/2002

* cited by examiner

*Primary Examiner*—Son T. Dinh
(74) *Attorney, Agent, or Firm*—Heller Ehrman White and McAuliffe LLP (57) ABSTRACT

The present invention relates to a nonvolatile memory device, and more specifically, to a programmable nonvolatile logic switch memory (register) device using a resistive memory device. The programmable nonvolatile register uses a logic switch or a nonvolatile resistive memory device whose resistive state can be set by flowing a controlled current through it.

23 Claims, 10 Drawing Sheets

Fig.1

(prior art)

Fig.2

(prior art)

NONVOLATILE MEMORY DEVICE

BACKGROUND OF THE INVENTION

1. Field of the Invention

The present invention relates to a nonvolatile memory device, and more specifically, to a programmable nonvolatile logic switch memory (register) using a resistive memory device.

2. Description of the Prior Art

Generally, nonvolatile memory such as magnetic memory and phase change memory (PCM) has a data processing speed similar to that of volatile RAM (Random Access Memory). When power is off, data of the nonvolatile memory are preserved.

Figure 1:
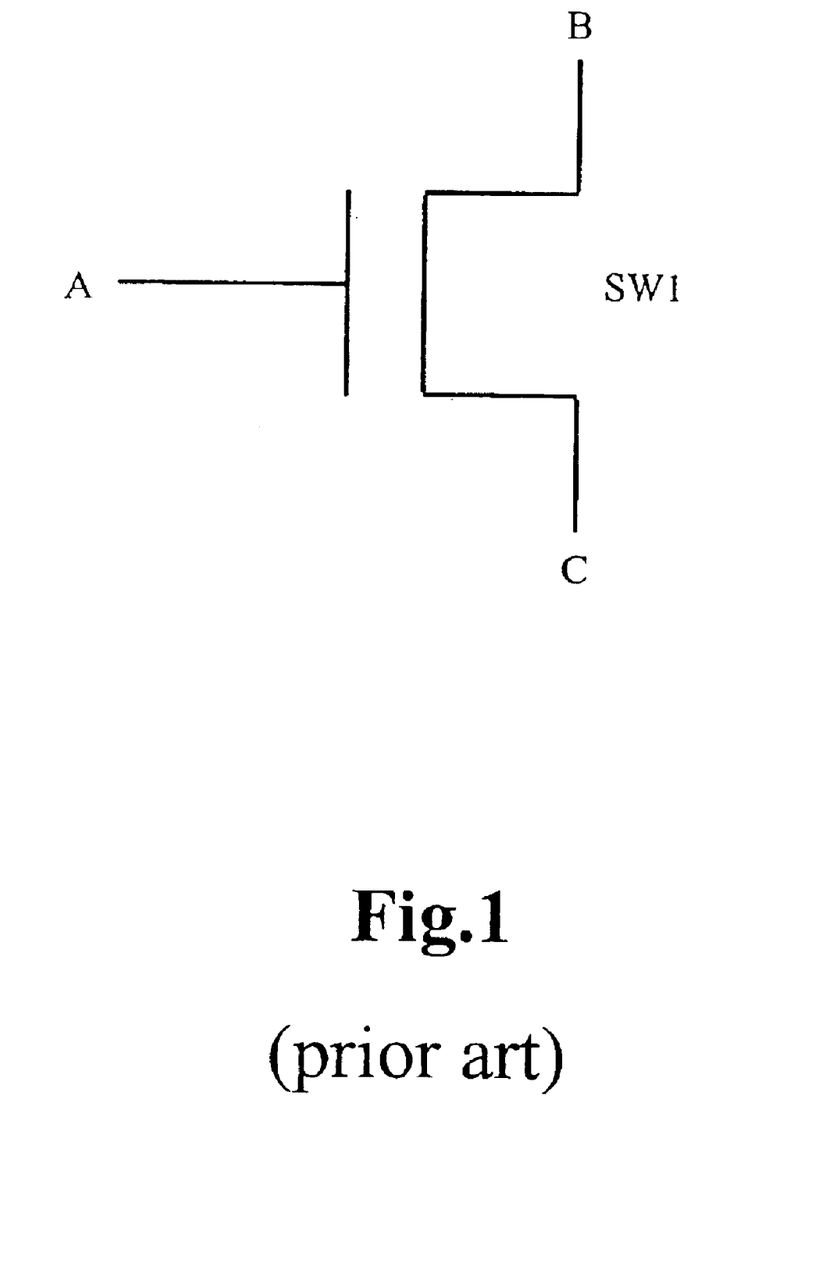
FIG. 1 is a circuit diagram illustrating a conventional volatile logic switch device.

FIG. 1 is a circuit diagram illustrating a conventional volatile logic switch device. Since conventional logic switch and register devices are volatile, data stored in such registers are not preserved when power is off.

A volatile logic switch SW1 connects a node B with a node C in response to a control signal applied to a gate input terminal A. The gate input terminal A of the volatile logic switch SW1 has no memory device for storing previous and current data. As a result, data stored in the memory device are not preserved when power is off.

Figure 2:
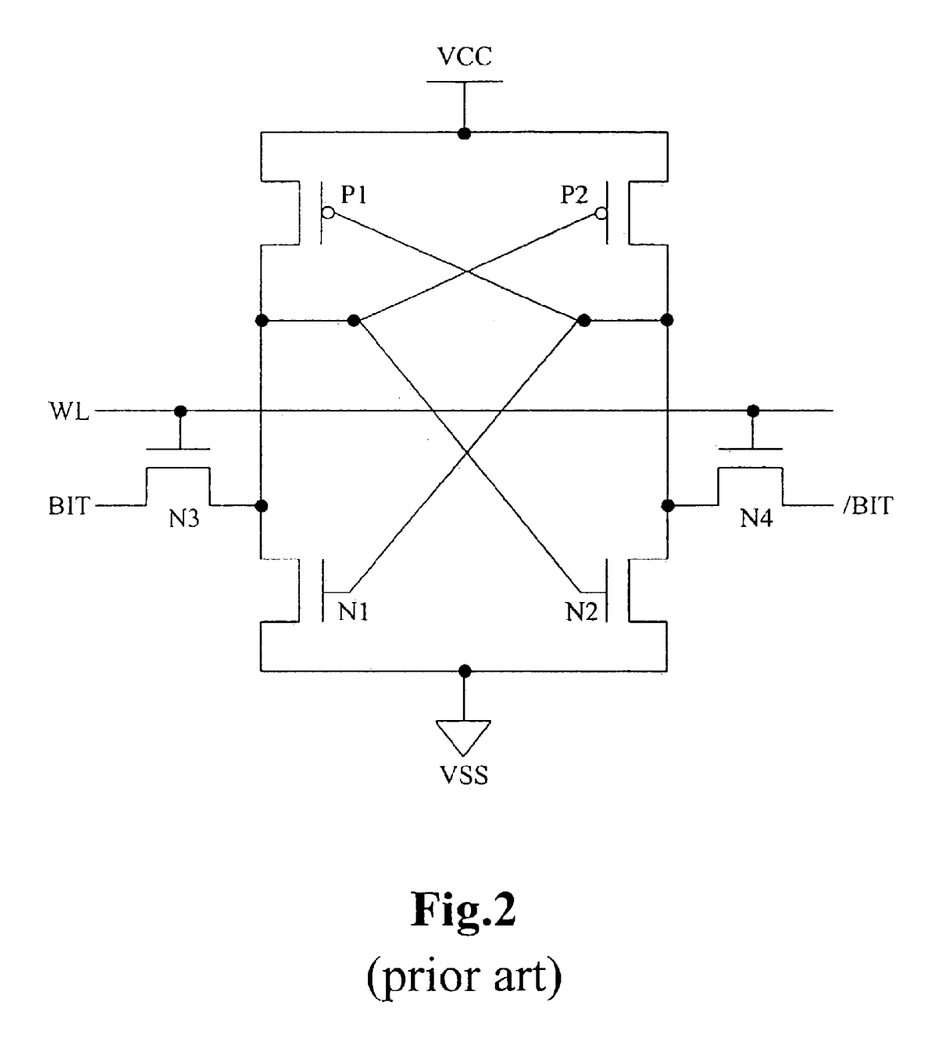
FIG. 2 is a circuit diagram illustrating a conventional flip-flop volatile memory device.

FIG. 2 is a circuit diagram illustrating a conventional flip-flop volatile memory device which is a SRAM (Static Random Access Memory).

The flip-flop volatile memory device comprises a flip-flop unit including PMOS transistors P1 and P2, and NMOS transistors N1 and N2. The flip-flop volatile memory device further comprises NMOS transistors N3 and N4 for storing data applied from bitlines BIT and /BIT in the flip-flop unit depending on an enable state of a wordline WL.

The conventional flip-flop volatile memory device can store data in both terminals of the flip-flop unit with a static state when power is on. However, the data stored in the terminals both of the flip-flop unit are destroyed when power is off.

Nonvolatile memory devices have been developed to overcome the above problem of the conventional volatile memory device. FIGS. 3a to 3d are diagrams illustrating a conventional phase change memory (PCM) device.

The PCM device 4 comprises a phase change layer (PCL) 2 of phase change material for receiving voltage and current between a top electrode 1 and a bottom electrode 3. The voltage and current induce high temperature in the PCL 2, thereby changing electric conductivity of the PCL 2.

Figure 3A:
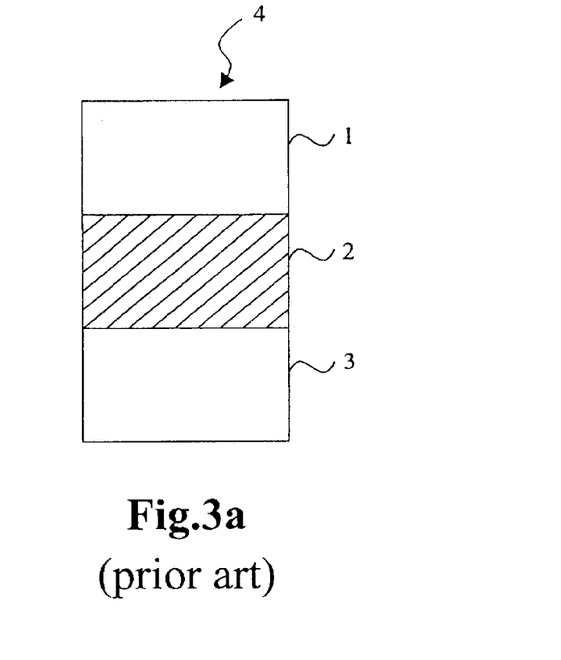
FIGS. 3a to 3d are diagrams illustrating a conventional PCM device.
Figure 3B:
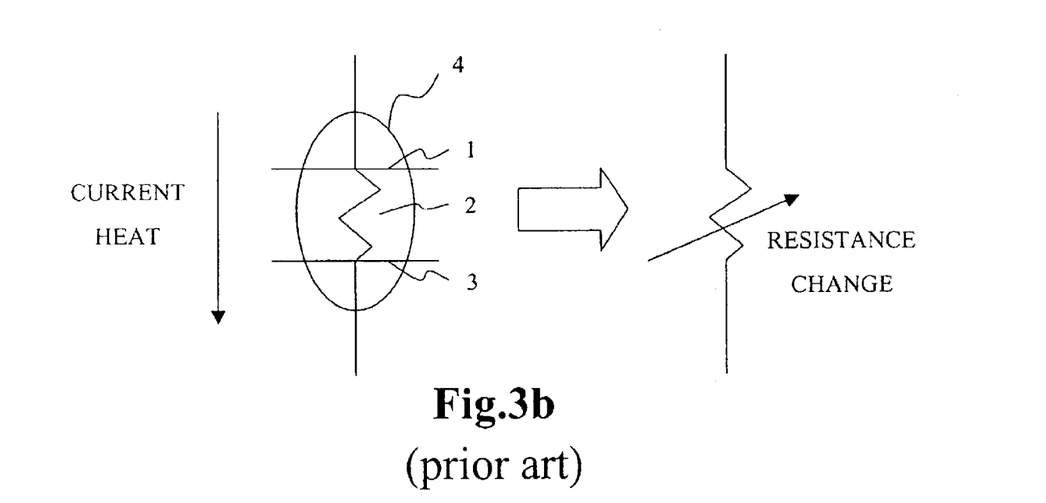
Figure 3C:
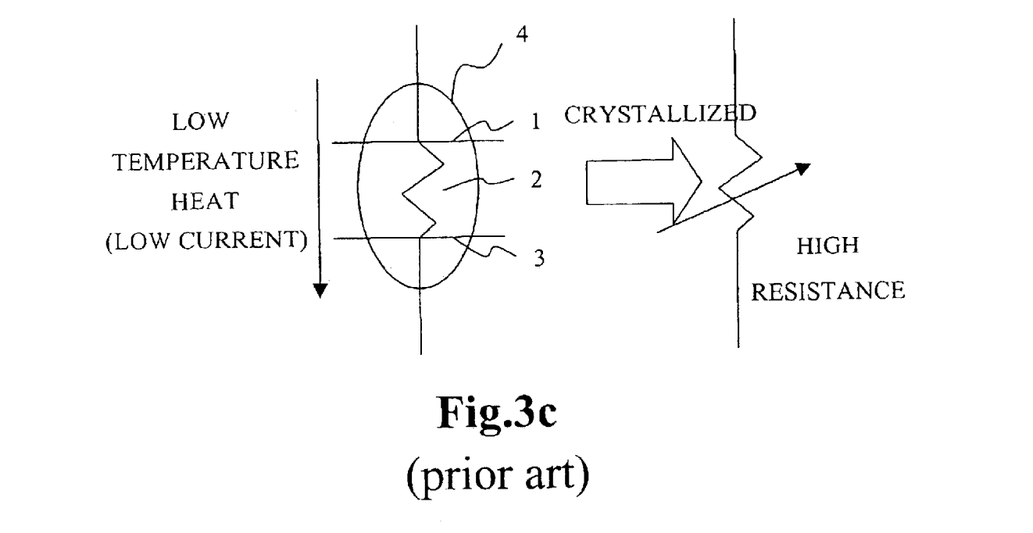

As shown in FIG. 3c, if low current of less than a threshold value flows in the PCM device 4, the PCL 2 has a proper temperature to be crystallized. Thus, the PCL 2 comes to have high resistance.

Figure 3D:
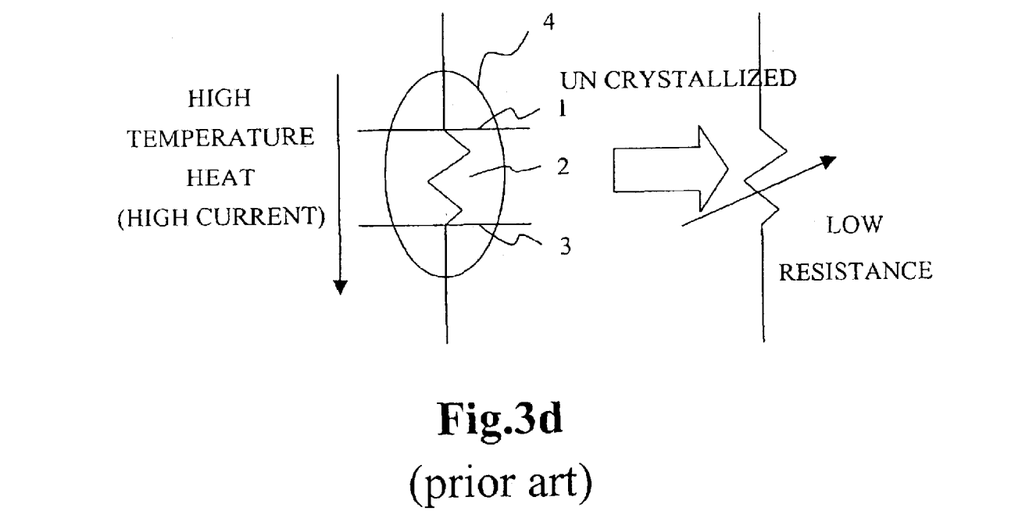

Referring to FIG. 3d, if high current of more than a threshold value flows in the PCM device 4, the PCL 2 has a temperature over a melting point of the phase change material. Thus, the PCL 2 becomes uncrystallized to have low resistance.

The PCM device 4 can store nonvolatile data corresponding to the two resistances.

SUMMARY OF THE INVENTION

Accordingly, it is an object of the present invention to provide a programmable nonvolatile logic switch memory (register) device using a nonvolatile resistance memory device.

In an embodiment, there is provided a nonvolatile memory device comprising a write/read controller, a nonvolatile resistive memory device and a logic switch. The write/read controller selectively controls write/read control signals enabled in a write mode. As used herein, a nonvolatile resistive memory device is a circuit element that stores different logic values in the level of electrical resistance of one or more circuit elements, such that the states of resistance of the element or elements can be changed or set (e.g., set to a high resistance or set to a low resistance) by controlling the amount of current that passes through the device when the write/read control signals are enabled. The logic switch selects switching states depending on the different logic values pre-stored in the nonvolatile resistive memory device when the write/read control signals are disabled.

In an embodiment, there is also provided a nonvolatile memory device comprising a flip-flop unit, a nonvolatile resistive memory device, an access controller and a current supply unit. The flip-flop unit includes a PMOS latch and a NMOS latch, and latch the opposite data. The nonvolatile resistive memory device, which is connected between the PMOS latch and the NMOS latch, stores different logic values depending on states of resistance changed by the amount of current. The access controller controls connection of a bitline and the flip-flop unit depending on an enable state of a wordline. The current supply unit supplies current for changing data stored in the resistive memory device when the write/read control signals are enabled.

In an embodiment, there is also provided a nonvolatile memory device comprising a flip-flop unit, a nonvolatile resistive memory device and an access controller. The flip-flop unit includes a NMOS latch for latching opposite data. The nonvolatile resistive memory device, which is connected between a power voltage terminal and the flip-flop unit, stores different logic values depending on states of resistance changed by the amount of current. The access controller controls a connection of a bitline to the flip-flop unit depending on an enable state of a wordline.

In an embodiment, there is provided a nonvolatile memory device comprising a flip-flop unit, an access controller and a nonvolatile resistive memory device. The flip-flop unit includes a NMOS latch for latching opposite data. The access controller controls a connection of a bitline to the flip-flop unit depending on an enable state of a wordline. The nonvolatile resistive memory device, which is connected between the flip-flop unit and the access controller, stores different logic values depending on states of resistance changed by the amount of current.

DETAILED DESCRIPTION OF THE PREFERRED EMBODIMENTS

The present invention will be described in detail with reference to the attached drawings.

Figure 4A:
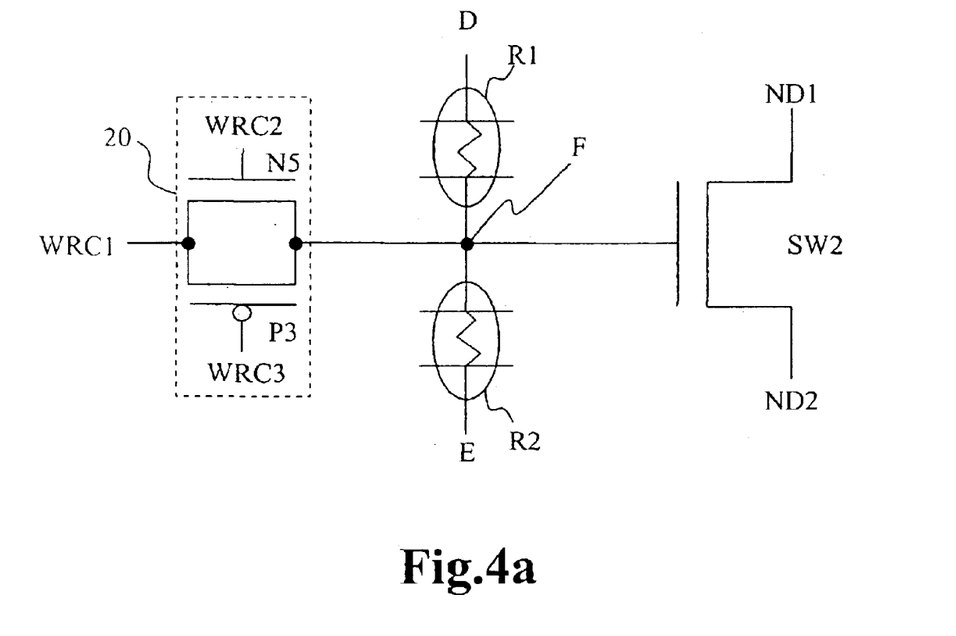
FIGS. 4a and 4b are circuit diagrams illustrating a nonvolatile memory device according to an embodiment of the present invention.

FIG. 4a is a circuit diagram illustrating a nonvolatile memory device used as a nonvolatile logic switch according to an embodiment of the present invention.

In an embodiment, the nonvolatile memory device comprises a write/read controller 20, resistance memory devices R1 and R2, and a logic switch SW2.

The write/read controller 20 selectively outputs a write/read control signal WRC1 in response to a write control signal WRC2 inputted into a gate of a NMOS transistor N5 and a write control signal WRC3 inputted into a gate of a PMOS transistor P3. The write control signal WRC2 has an opposite phase to that of the write control signal WRC3.

The resistive memory device R1 is connected between a node D and a node F. The resistive memory device R2 is connected between a node E and a node F. The node F is connected to a gate of the logic switch SW2.

Next, the write operation according to an embodiment of the present invention is described.

When the write control signal WRC2 inputted in the write/read controller 20 is at a high level, the NMOS transistor N5 is turned on. When the write control signal WRC3 is at a low level, the PMOS transistor P3 is turned on, and the write/read control signal WRC1 is outputted.

If current is applied between the nodes D and F, data is written in the resistive memory device R1. If current is applied between the nodes E and F, data is written in the resistive memory device R2.

Figure 4B:
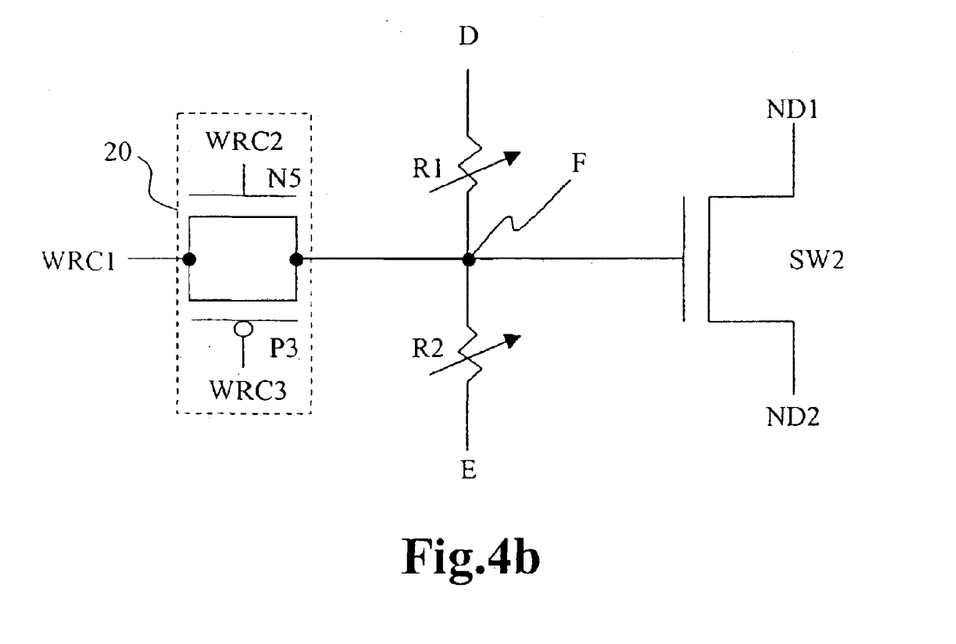

The resistive memory devices R1 and R2 of FIG. 4a may be represented like those in FIG. 4b.

When the write control signal WRC2 is at a low level and the write control signal WRC3 is at a high level, the NMOS transistor N5 and the PMOS transistor P3 of the write/read controller 20 are all turned off. Here, when the resistive memory device R1 has a low resistance and the resistive memory device R2 has a high resistance, the states of the logic switch SW2 are determined depending on states of input signals through the input nodes D and E.

Table 1 shows the operation of the logic switch SW2 depending on input signals when low data is stored in the resistive memory device R1 and the high data is stored in the resistive memory device R2.

TABLE 1

| D | E | R1 | R2 | SW2 |
|---|---|----|----|-----|
| L | L | L  | H  | OFF |
| H | L | L  | H  | ON  |
| L | H | L  | H  | OFF |
| H | H | L  | H  | ON  |

When a high level signal is applied to the node D and a high or low level signal is applied to the node E, the logic switch SW2 is turned on to output a signal of the node ND1 into the node ND2.

On the other hand, when a low level signal is applied to the node D and a low or high level signal is a applied to the node E, the logic switch SW2 is turned off. As a result, the signal of the node ND1 is not outputted into the node ND2.

When the resistive memory device R1 has a high resistance and the resistive memory device R2 has a low resistance, the states of the logic switch SW2 are determined depending on states of input signals inputted through the input nodes D and E.

Table 2 shows the operation of the logic switch SW2 depending on the input signals when high data is stored in the resistive memory device R1 and low data is stored in the resistive memory device R2.

TABLE 2

| D | E | R1 | R2 | SW2 |
|---|---|----|----|-----|
| L | L | H  | L  | OFF |
| H | L | H  | L  | OFF |
| L | H | H  | L  | ON  |
| H | H | H  | L  | ON  |

When a high or low level signal is applied to the node D and a high level signal is applied to the node E, the logic switch SW2 is turned on to output a signal of the node ND1 into the node ND2.

When the high or low level signal is applied to the node D and a low level signal is applied to the node E, the logic switch SW2 is turned off. As a result, the signal of the node ND1 is not outputted into the node ND2.

Figure 5:
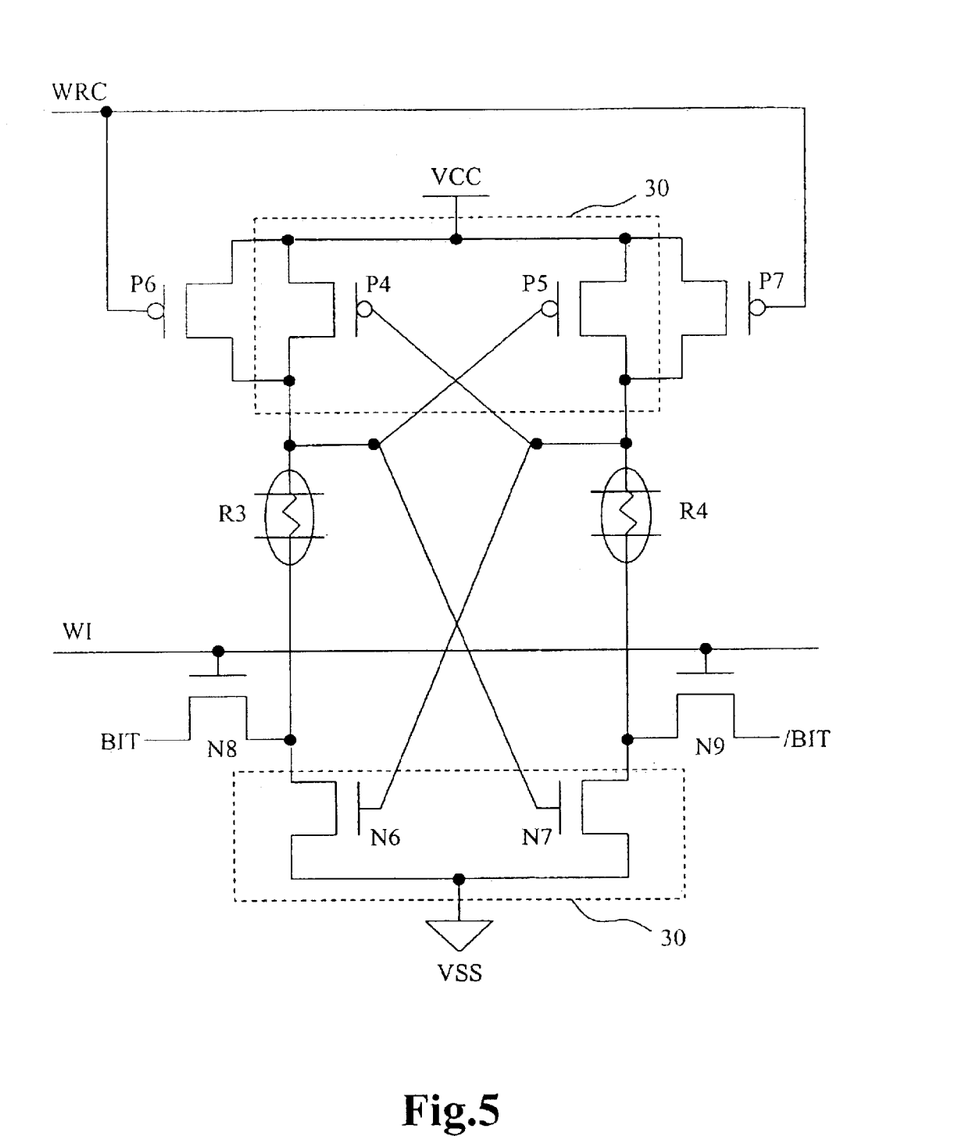
FIGS. 5 to 9 are circuit diagrams illustrating a nonvolatile memory device according to other embodiments of the present invention.

FIG. 5 is a circuit diagram illustrating a nonvolatile memory device used as a nonvolatile logic register according to other embodiment of the present invention.

In an embodiment, the nonvolatile memory device comprises a flip-flop unit 30, resistive memory devices R3 and R4, an access controller including NMOS transistors N8 and N9, and a current supply unit including PMOS transistors P6 and P7.

The flip-flop unit 30 comprises a NMOS latch including NMOS transistors N6 and N7, and a PMOS latch including PMOS transistors P4 and P5. The NMOS latch and the PMOS latch store opposite data.

The resistive memory device R3, which is connected to a common drain of the PMOS transistor P4 and the NMOS transistor N6, stores nonvolatile data. The resistive memory device R4, which is connected to a common drain of the PMOS transistor P5 and the NMOS transistor N7, stores nonvolatile data.

The access controller, including the NMOS transistors N8 and N9, controls a connection of bitlines BIT and /BIT depending on an enable state of a wordline WL. The NMOS transistor N8 having a gate connected to the wordline WL is connected between the bitline BIT and the drain of the NMOS transistor N6. The NMOS transistor N9 having a gate connected to the wordline WL is connected between the bitline /BIT and the drain of the NMOS transistor N7.

The current supply unit comprises PMOS transistor P6 and P7 for changing data stored in the resistive memory devices R3 and R4 in a write mode. The PMOS transistor P6 connected in parallel to the PMOS transistor P4 has a gate to receive a write/read control signal WRC. The PMOS transistor P7 connected in parallel to the PMOS transistor P5 has a gate to receive the write/read control signal WRC.

Gate input signals of the PMOS latch and the NMOS latch are connected to the resistive memory devices R3 and R4 with a positive feedback type circuit.

When the write/read control signal WRC is at a low level, the PMOS transistors P6 and P7 are turned on to apply a predetermined voltage to the bitlines BIT and /BIT. Then, a difference in current flowing in the resistive memory devices R3 and R4 is generated by a difference in voltages of the bitlines BIT and /BIT. As a result, the amount of heat applied to the resistive memory devices R3 and R4 is also differentiated.

Here, voltages of the bitlines BIT and /BIT are determined to generate heat in the resistive memory devices R3 and R4 over or below the melting point.

Figure 6:
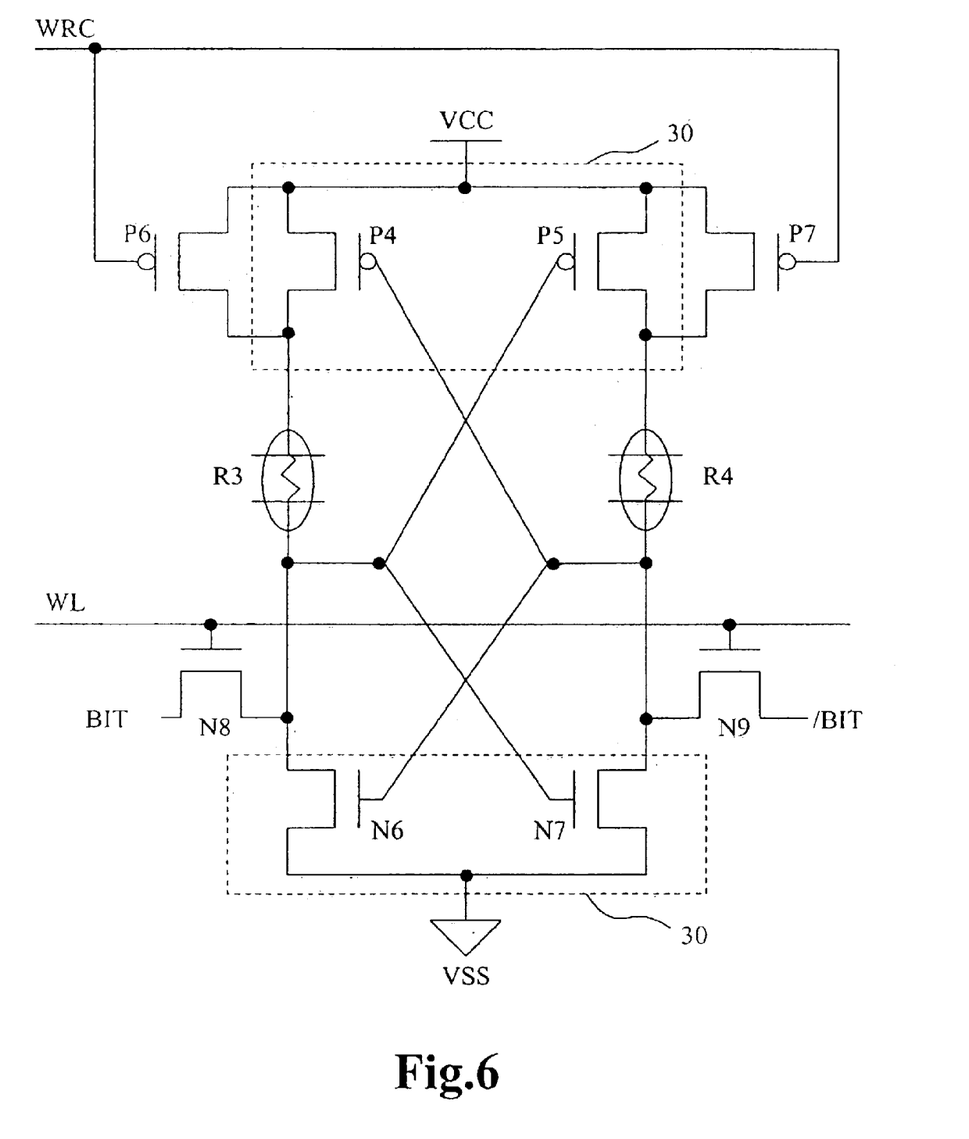

FIG. 6 is a circuit diagram illustrating a nonvolatile memory device according to other embodiment of the present invention.

The embodiment shown in FIG. 6 is different from that of FIG. 5 in that gate input signals of the PMOS latch P4,P5 and the NMOS latch N6,N7 are connected to the resistive memory devices R3 and R4 with a negative feedback type circuit. The explanation of the rest configuration and operation is omitted because it is similar to that of FIG. 5.

Figure 7:
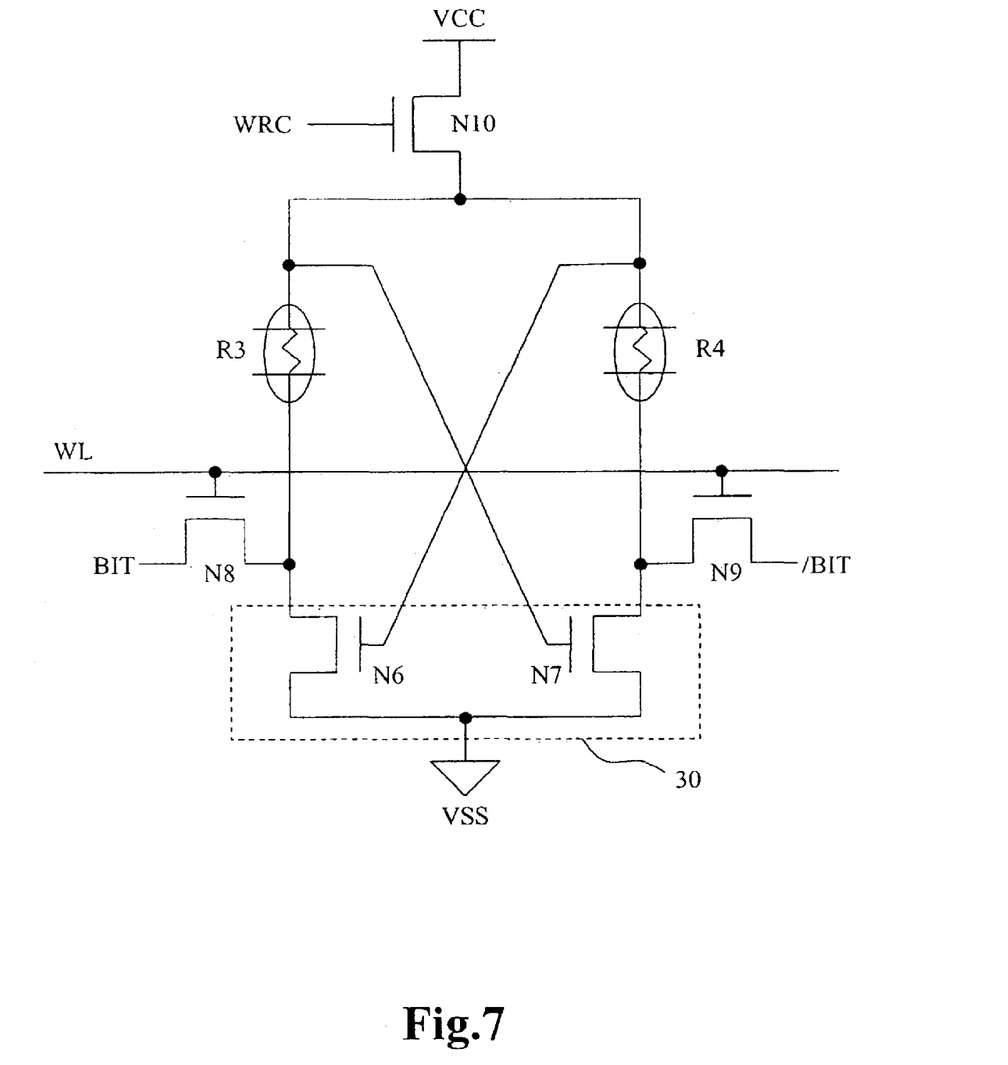

FIG. 7 is a circuit diagram illustrating a nonvolatile memory device according to another embodiment of the present invention.

In this embodiment, the nonvolatile memory device comprises a flip-flop unit 30, resistive memory devices R3 and R4, an access controller including NMOS transistors N8 and N9, and a driver which is a NMOS transistor N10.

The flip-flop unit 30 comprises a NMOS latch including NMOS transistors N6 and N7. Gate input signals of the NMOS transistors N6 and N7 are connected to the resistive memory devices R3 and R4 with a positive feedback type circuit.

The resistive memory device R3, which is connected to a common drain of the NMOS transistors N6 and N10, stores nonvolatile data. The resistive memory device R4, which is connected to a common drain of the NMOS transistors N7 and N10, stores nonvolatile data.

The access controller comprises NMOS transistors N8 and N9 for controlling connection of bitlines BIT and /BIT depending on an enable state of a wordline WL. The NMOS transistor N8 having a gate connected to the wordline WL is connected between the bitline BIT and a drain of the NMOS transistor N6. The NMOS transistor N9 having a gate connected to the wordline WL is connected between the bitline /BIT and a drain of the NMOS transistor N7.

The driver comprises a NMOS transistor N10. The NMOS transistor N10, connected between a power voltage VCC terminal and the resistive memory devices R3 and R4, has a gate to receive a write/read control signal WRC.

Figure 8:
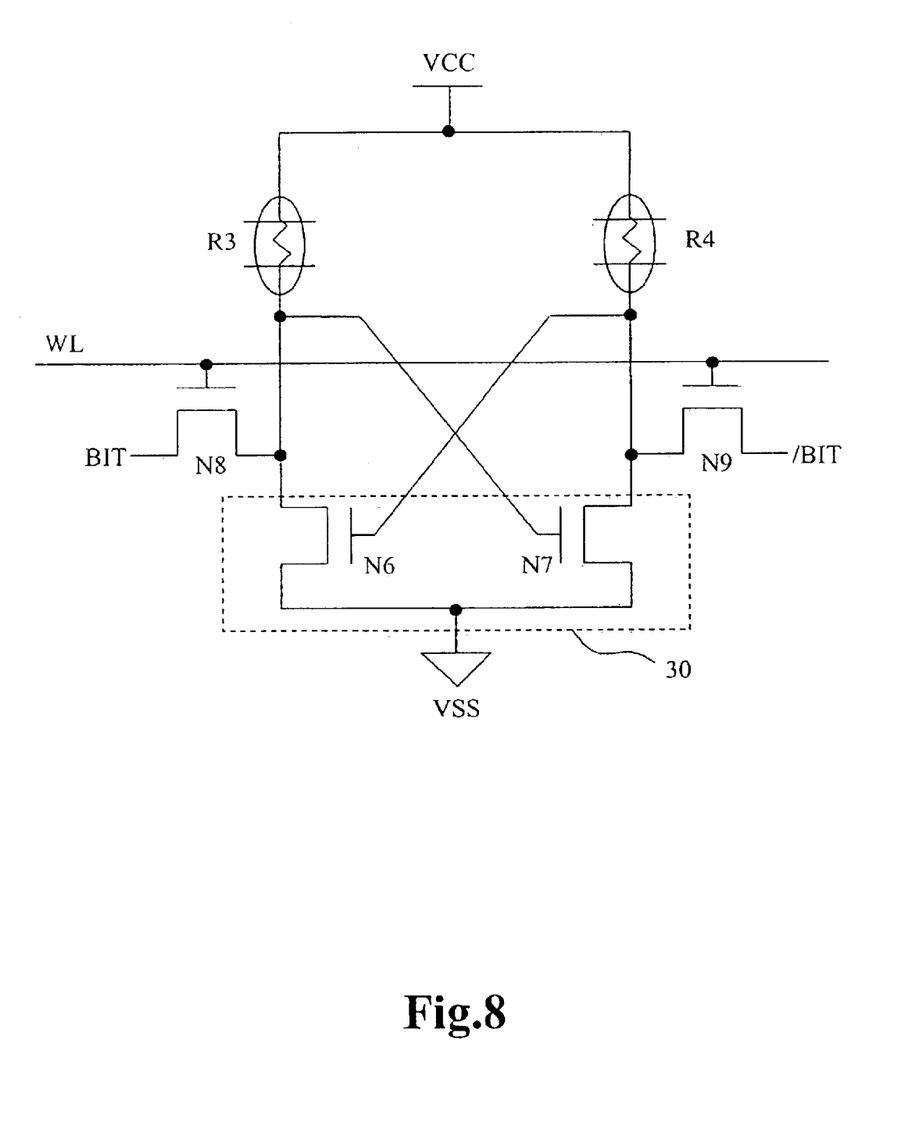

FIG. 8 is a circuit diagram illustrating a nonvolatile memory device according to another embodiment of the present invention.

In the nonvolatile memory device of FIG. 8, gate input signals of NMOS transistors N6 and N7 are connected to resistive memory devices R3 and R4 with a negative feedback type circuit. The nonvolatile memory device of FIG. 8 does not comprise a NMOS transistor N10 like that of FIG. 7. The explanation of the rest configuration and operation is omitted because it is similar to that of FIG. 7.

Figure 9:
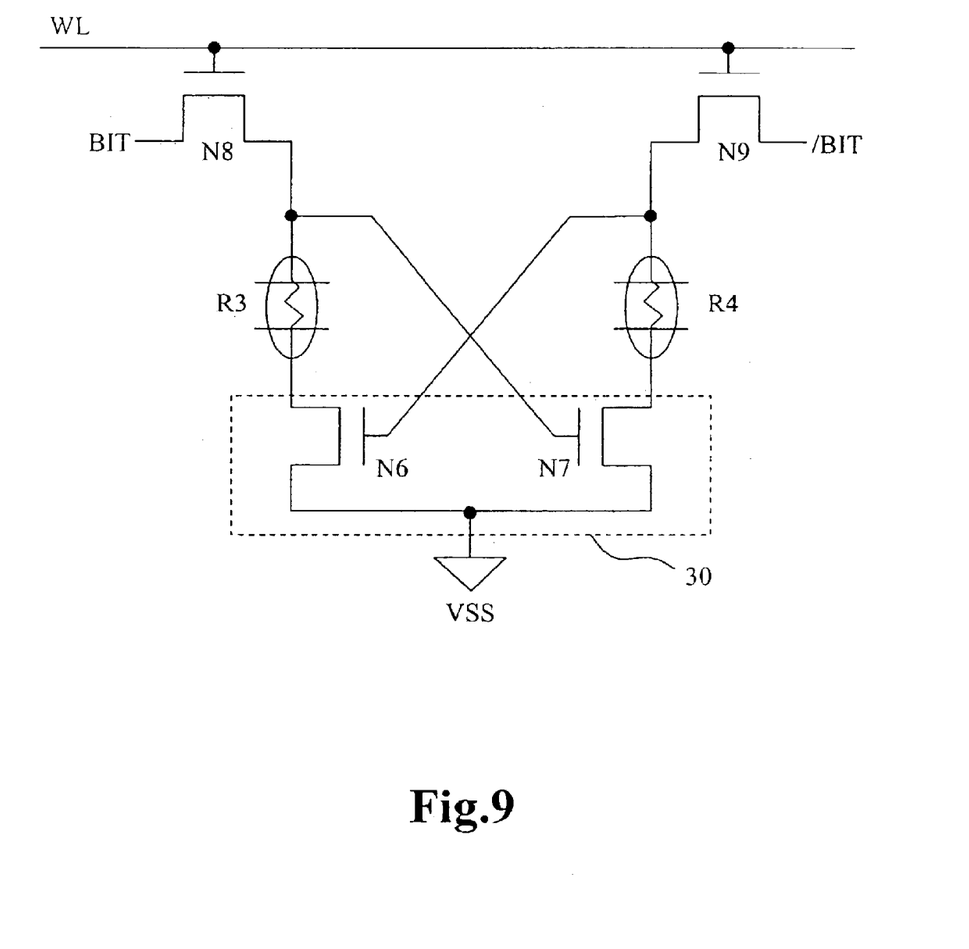

FIG. 9 is a circuit diagram illustrating a nonvolatile memory device according to another embodiment of the present invention.

The nonvolatile memory device of FIG. 9 comprises a flip-flop unit 30, resistive memory devices R3 and R4, and an access controller including NMOS transistors N8 and N9.

The flip-flop unit 30 comprises a NMOS latch including NMOS transistors N6 and N7. Gate input signals of the NMOS transistors N6 and N7 are connected to the resistive memory devices R3 and R4 with a positive feedback type circuit.

The resistive memory device R3, connected between a terminal of the NMOS transistor P8 and a drain of the NMOS transistor N6, stores nonvolatile data. The resistive memory device R4, connected between a terminal of the NMOS transistor P9 and a drain of the NMOS transistor N7, stores nonvolatile data.

The access controller including the NMOS transistors N8 and N9 controls a connection of bitlines BIT and /BIT depending on an enable state of a wordline WL. The NMOS transistor N8 having a gate connected to the wordline WL is connected between the bitline BIT and a terminal of the resistive memory device R3. The NMOS transistor N9 having a gate connected to the wordline WL is connected between the bitline /BIT and a terminal of the resistive memory device R4.

Although a PCM device is exemplified as a resistive memory device in the above embodiments, a MTJ (Magnetic Tunneling Junction) or GMR (Giant Magnetic Resistive) device can be used as a resistive memory device alternatively.

Additionally, a nonvolatile memory device according to an embodiment of the present invention can be utilized as a nonvolatile programmable gate memory device such as a FPGA (Field Programmable Gate Array).

As discussed earlier, a nonvolatile memory device can be embodied using a resistive memory device in an embodiment of the present invention. Such a programmable register is applied to a memory chip in order to program data for regulating redundancy and reference with a software type, thereby improving reliability of the chip.

While the invention is susceptible to various modifications and alternative forms, specific embodiments have been shown by way of example in the drawings and described in detail herein. However, it should be understood that the invention is not limited to the particular forms disclosed. Rather, the invention covers all modifications, equivalents, and alternatives falling within the spirit and scope of the invention as defined in the appended claims.

What is claimed is:

1. A nonvolatile memory device having a write mode of operation, comprising:
   a write/read controller configured to selectively control write/read control signals enabled in the write mode;
   a nonvolatile resistive memory device coupled to receive write/read control signals from the write/read controller; and
   a logic switch having two or more switching states configured to select among the switching states depending on a logic value stored in the nonvolatile resistive memory device when the write/read control signals are disabled.

2. The nonvolatile memory device according to claim 1, wherein the write/read controller comprises:
   a first NMOS transistor controlled by a first write control signal;
   a first PMOS transistor connected in parallel to the first NMOS transistor and controlled by a second write control signal having an opposite phase to the first write control signal.

3. The nonvolatile memory device according to claim 1, wherein the nonvolatile resistive memory device comprises:
   a first resistive memory device having a resistive state connected between a first input node and an output node of the write/read controller; and
   a second resistive memory device having a settable resistive state connected between a second input node and the output node of the write/read controller.

4. The nonvolatile memory device according to claim 3, wherein the selection of a switching state of the logic switch is determined based on a state of a first input signal inputted into the first resistive memory device when the first resistive memory device is set at a low resistance state and the second resistive memory device is set at a high resistance state, and the selection of a switching state of the logic switch is determined based on a state of a second input signal inputted into the second resistive memory device when the first resistive memory device is set at a high resistance state and the second resistive memory device is set at a low resistance state.

5. The nonvolatile memory device according to claim 4, wherein each of the first and the second resistive memory devices comprises:

a first electrode connected to one of the first input node or the second input node;

a second electrode connected to an output node of the write/read controller; and a phase change layer formed between the first electrode and the second electrode.

6. The nonvolatile memory device according to claim 1, wherein the nonvolatile resistive memory device comprises at least one of a phase change memory device, a magnetoresistive device and a metal memory device.

7. A nonvolatile memory device, comprising:

a flip-flop unit comprising a PMOS latch configured to latch a datum and a NMOS latch configured to latch a complement of the datum;

a nonvolatile resistive memory device connected between the PMOS latch and the NMOS latch;

an access controller for controlling a connection of a bitline and the flip-flop unit depending on an enable state of a wordline; and a current supply unit configured to supply current for changing data stored in the nonvolatile resistive memory device when write/read control signals are enabled.

8. The nonvolatile memory device according to claim 7, wherein gate input signals of the PMOS latch and the NMOS latch are connected to the nonvolatile resistive memory device with either a positive feedback type circuit or a negative feedback type circuit.

9. The nonvolatile memory device according to claim 7, wherein the nonvolatile resistive memory device comprises a first resistive memory device and a second resistive memory device, each of the first and second resistive memory devices configured to store different logic values depending on a difference in an amount of current generated by a voltage applied to the bitline when the write/read control signals are enabled.

10. The nonvolatile memory device according to claim 9, wherein each of the first resistive memory device and the second resistive memory device comprises:

a first electrode connected to the PMOS latch;

a second electrode connected to the NMOS latch; and a phase change layer formed between the first electrode and the second electrode.

11. The device according to claim 7, wherein the current supply unit comprises a first PMOS transistor and a second PMOS transistor, each of the first and second PMOS transistors configured to be connected in parallel to the PMOS latch and to have a gate configured to receive the write/read control signals.

12. A nonvolatile memory device, comprising:

a flip-flop unit comprising a NMOS latch for latching data;

a nonvolatile resistive memory device, connected between a power voltage terminal and the flip-flop unit; and an access controller for controlling a connection of a bitline and the flip-flop unit depending on an enable state of a wordline.

13. The nonvolatile memory device according to claim 12, wherein the NMOS latch comprises a first NMOS transistor and a second NMOS transistor configured to be connected between the resistive memory device and a ground voltage terminal with a latch type circuit, and gate input signals of the first and the second NMOS transistors are connected to the nonvolatile resistive memory device with either a positive feedback type circuit or a negative feedback type circuit.

14. The nonvolatile memory device according to claim 12, wherein the nonvolatile resistive memory device comprises a first resistive memory device and a second resistive memory device, each of the first and second resistive memory device configured to store different logic values depending on a difference in an amount of current generated by a voltage applied to the bitline.

15. The nonvolatile memory device according to claim 14, wherein each of the first and the second resistive memory devices comprises:

a first electrode connected to the power voltage terminal;

a second electrode connected to the NMOS latch; and a phase change layer formed between the first electrode and the second electrode.

16. The nonvolatile memory device according to claim 12, further comprising a driver circuit configured to supply a power voltage to the nonvolatile resistive memory device when write/read control signals are enabled.

17. A nonvolatile memory device, comprising:

a flip-flop unit including a NMOS latch for latching a datum and its complement;

an access controller for controlling a connection of a bitline to the flip-flop unit depending on an enable state of a wordline; and a phase change memory device connected between the flip-flop unit and the access controller.

18. The nonvolatile memory device according to claim 17, wherein the NMOS latch comprises a first NMOS transistor and a second NMOS transistor configured to be connected between the phase change memory device and a ground voltage terminal with a latch circuit, and gate input signals of the first and the second NMOS transistors are connected to the phase change memory device with a positive feedback type circuit.

19. The nonvolatile memory device according to claim 17, wherein the phase change memory device comprises a first phase change memory device and a second phase change memory device, each phase change memory device configured to store different logic values depending on a difference in an amount of current generated by a voltage applied to the bitline.

20. The nonvolatile memory device according to claim 19, wherein each of the first and the second phase change memory device comprises:

a first electrode connected to the access controller;

a second electrode connected to the NMOS latch; and a phase change layer formed between the first electrode and the second electrode.

21. An electronic device, comprising:

a write/read controller means for selectively controlling write/read control signals enabled in a write mode;

a resistive memory means for storing data based on states of resistance that can be changed by passing an amount of current through the means when the write/read control signals are enabled; and a logic switch means for selecting among switching states based on logic values stored in the resistive memory means when the write/read control signals are disabled.

22. An electronic device comprising:

a means for latching data;

a phase change memory means for storing data as states of resistance that can be set by an applied electrical current, the phase change memory means being coupled to the means for latching data;

an access controller means for connecting a data input to the means for latching data in response to an enable state of a wordline; and a current supply means for supplying current to the phase change memory means for changing a resistive state in response to a write control signal.

23. A method for storing data in a memory, comprising the steps of:

selectively controlling write/read control signals enabled in a write mode of a controller;

storing data in a resistive memory based on states of resistance that can be changed by passing an amount of current through the resistive memory when the write/read control signals are enabled; and selecting among switching states based on logic values stored in the resistive memory when the write/read control signals are disabled.

* * * * *